United States Patent
Takeya et al.

(10) Patent No.: US 9,837,902 B2
(45) Date of Patent: Dec. 5, 2017

(54) SWITCHING POWER SOURCE DEVICE, SEMICONDUCTOR DEVICE, AND AC/DC CONVERTER

(71) Applicant: Renesas Electronics Corporation, Tokyo (JP)

(72) Inventors: Norisato Takeya, Tokyo (JP); Masashi Oshiba, Tokyo (JP); Satoshi Kumaki, Tokyo (JP); Yasutaka Horikoshi, Tokyo (JP)

(73) Assignee: Renesas Electronics Corporation, Tokyo (JE)

( * ) Notice: Subject to any disclaimer, the term of this patent is extended or adjusted under 35 U.S.C. 154(b) by 0 days.

(21) Appl. No.: 14/904,052

(22) PCT Filed: Aug. 1, 2013

(86) PCT No.: PCT/JP2013/070885
§ 371 (c)(1),
(2) Date: Jan. 8, 2016

(87) PCT Pub. No.: WO2015/015616
PCT Pub. Date: Feb. 5, 2015

(65) Prior Publication Data
US 2016/0172975 A1 Jun. 16, 2016

(51) Int. Cl.
*H02M 3/158* (2006.01)
*H02M 1/08* (2006.01)
(Continued)

(52) U.S. Cl.
CPC ............ *H02M 3/158* (2013.01); *H02M 1/08* (2013.01); *H02M 1/12* (2013.01); *H02M 1/15* (2013.01);
(Continued)

(58) Field of Classification Search
CPC ............ H02M 1/08; H02M 1/12; H02M 1/15; H02M 1/4225; H02M 3/157; H02M 3/1584; H02M 2001/0029
See application file for complete search history.

(56) References Cited

U.S. PATENT DOCUMENTS

2002/0000923 A1  1/2002  Nishikawa
2009/0174340 A1* 7/2009  Kumagai ............... H02M 3/155
                                                              315/291
(Continued)

FOREIGN PATENT DOCUMENTS

JP       2001-327166 A       11/2001
JP       2007-209130 A        8/2007
(Continued)

OTHER PUBLICATIONS

International Search Report (ISR) (PCT Form PCT/ISA/210), in PCT/JP2013/070885, dated Sep. 3, 2013.

*Primary Examiner* — Jue Zhang
*Assistant Examiner* — Lakaisha Jackson
(74) *Attorney, Agent, or Firm* — McGinn IP Law Group, PLLC

(57) ABSTRACT

The switching power source device obtains a desired DC voltage by controlling the current flowing through a coil by turning on and off a switching element by a PWM control. In the PWM ON period to turn on the switching element by the PWM control, the switching power source device is enabled to switch the switching element by a first pulse signal whose cycle is shorter than the PWM cycle and whose pulse width is gradually increased, in a first period just after the start of the PWM ON period. Further, the switching power source device is enabled to switch the switching element by a PWM signal based on the PWM control after the first period in the PWM ON period has elapsed. Accord-
(Continued)

ing to this approach, it is possible to reduce the harmonic noise.

14 Claims, 8 Drawing Sheets

(51) Int. Cl.
*H02M 1/12* (2006.01)
*H02M 1/42* (2007.01)
*H03K 17/16* (2006.01)
*H02M 7/06* (2006.01)
*H02M 1/15* (2006.01)
*H02M 3/157* (2006.01)
*H02M 1/00* (2006.01)

(52) U.S. Cl.
CPC ......... *H02M 1/4225* (2013.01); *H02M 3/157* (2013.01); *H02M 3/1584* (2013.01); *H02M 7/06* (2013.01); *H03K 17/162* (2013.01); *H03K 17/168* (2013.01); *H02M 2001/0029* (2013.01); *Y02B 70/126* (2013.01)

(56) References Cited

U.S. PATENT DOCUMENTS

| 2009/0190382 | A1* | 7/2009 | Usui ................... H02M 1/4225 363/89 |
| 2010/0188874 | A1 | 7/2010 | Sato et al. |
| 2010/0226149 | A1* | 9/2010 | Masumoto .......... H02M 1/4225 363/20 |
| 2012/0243264 | A1* | 9/2012 | Nakagawa ............ H02M 3/156 363/16 |
| 2014/0232365 | A1* | 8/2014 | Sasaki ................... H02M 3/156 323/282 |

FOREIGN PATENT DOCUMENTS

| JP | 2008-099440 A | 4/2008 |
| JP | 2008-312355 A | 12/2008 |
| JP | 2010-200437 A | 9/2010 |
| JP | 2010-233439 A | 10/2010 |
| JP | 2012-080739 A | 4/2012 |

* cited by examiner

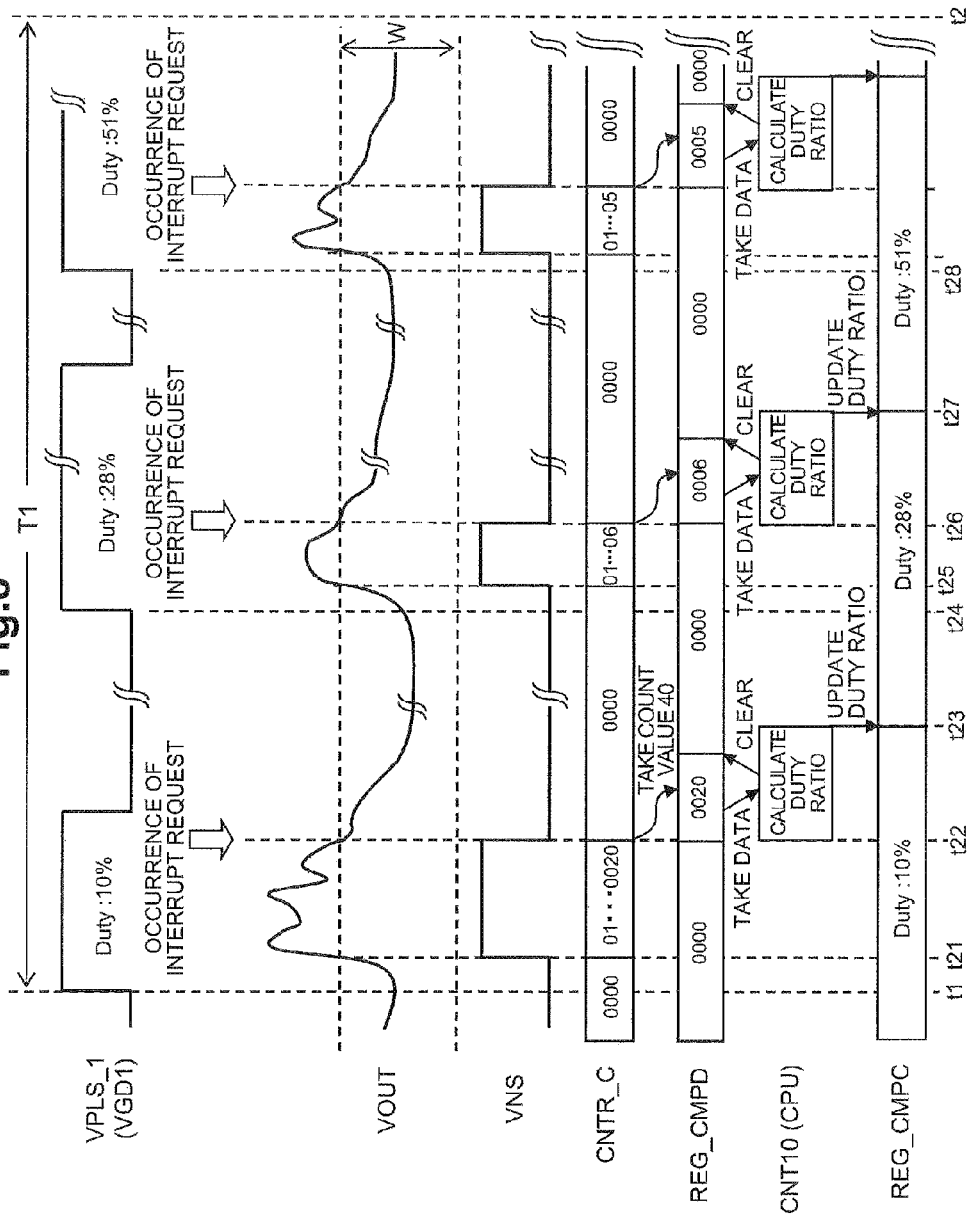

SWITCHING POWER SOURCE DEVICE, SEMICONDUCTOR DEVICE, AND AC/DC CONVERTER

TECHNICAL FIELD

The present invention relates to a switching power source device and a semiconductor device for controlling a switching element configuring the switching power source device. In particular, the present invention relates to techniques that are effective when applied to a switching power source device including a PFC (Power Factor Correction) circuit.

BACKGROUND ART

In a switching power source device configuring an AC/DC converter for converting an AC voltage to a DC voltage, a PFC circuit is widely used to reduce the power factor degradation and occurrence of harmonic noise due to the phase difference between the input voltage supplied from an AC power source and the input current.

In the past, various switching power source devices including PFC circuits have been realized mainly by an analog control. For example, in Patent Documents 1 and 2, there are disclosures as the prior art switching power source device including an analog control PFC circuit.

However, in order to meet the recent demand for cost reduction, easy tuning, and the like, the control method of various switching power source circuits including PFC circuits has been replaced by that mainly base on digital control. More specifically, a control part for controlling the ON/OFF of a switching element (MOSFET, and the like) to control the current flowing through a coil in a PFC circuit has been replaced by a program process device such as a microcontroller (hereinafter, simply referred to as micon) from a conventional analog IC (Integrated Circuit) including an error amplifier. For example, in Patent Document 3, there is a disclosure as the prior art AC/DC converter including a PFC circuit of digital control method.

CITATION LIST

Patent Documents

Patent Document 1: Japanese Unexamined Patent Application Publication No. 2001-327166
Patent Document 2: Japanese Unexamined Patent Application Publication No. 2008-312355
Patent Document 3: Japanese Unexamined Patent Application Publication No. 2008-99440

DISCLOSURE OF THE INVENTION

Problems that the Invention is to Solve

In the PFC circuit described above, a control part detects various voltages and currents within the PFC circuit and generates a PWM (pulse width modulation) signal of a predetermined cycle based on the detection result. For example, the PFC circuit of the analog control method generates a PWM signal of a desired duty ratio (pulse width) based on the output voltage of the error amplifier and on a predetermined cycle signal (triangle wave, saw wave, or the like). The PFC circuit of the digital control method generates a PWM signal of the duty ratio according to the setting conditions of the CPU, for example, by a PWM timer in the micon. Based on the PWM signal generated as described above, the ON/OFF of the switching element is controlled in order to generate a desired DC voltage and, at the same time, to improve the power factor.

As described above, when the ON/OFF of the switching element is switched based on the PWM signal, a large current change occurs at the timing of switching on/off the switching element due to a sharp rise or fall of the PWM signal, and harmonic noise is generated. The generation of the harmonic noise leads to a reduction in the power factor, which can contribute to the reduction in the power conversion efficiency in the AC/DC conversion. In particular, the reduction in the power conversion efficiency becomes significant as the power that the AC/DC converter handles increases.

The means and method for solving the above problems will be described below. These and other objects and advantages of the present invention will become more apparent from the following description taken in conjunction with the accompanying drawings.

Means for Solving the Problems

A brief summary of a typical one of the embodiments disclosed in the present application is as follows.

There is provided a switching power source device that obtains a desired DC voltage by controlling the current flowing through a coil by turning on/off a switching element by a PWM control. During the PWM ON period in which the switching element is turned on by the PWM control, the switching power source device is enabled to switch the switching element by a first pulse signal, whose cycle is shorter than the PWM cycle and whose pulse width is gradually increased, in a first period just after the start of the PWM ON period. Further, the switching power source device is enabled to switch the switching element by the PWM signal based on the PWM control after the first period has elapsed in the PWM ON period.

Effects of the Invention

The effect obtained by a typical one of the embodiments disclosed in the present application is described in brief as follows.

That is, according to the switching power source device, it is possible to reduce the harmonic noise.

BRIEF DESCRIPTION OF THE DRAWINGS

FIG. 8 shows an example of the timing chart of the pulse signal VPLS_1 generated by the PWM timer part according to the second embodiment.

DESCRIPTION OF EMBODIMENTS

1. Summary of the Embodiments

Figure 1:
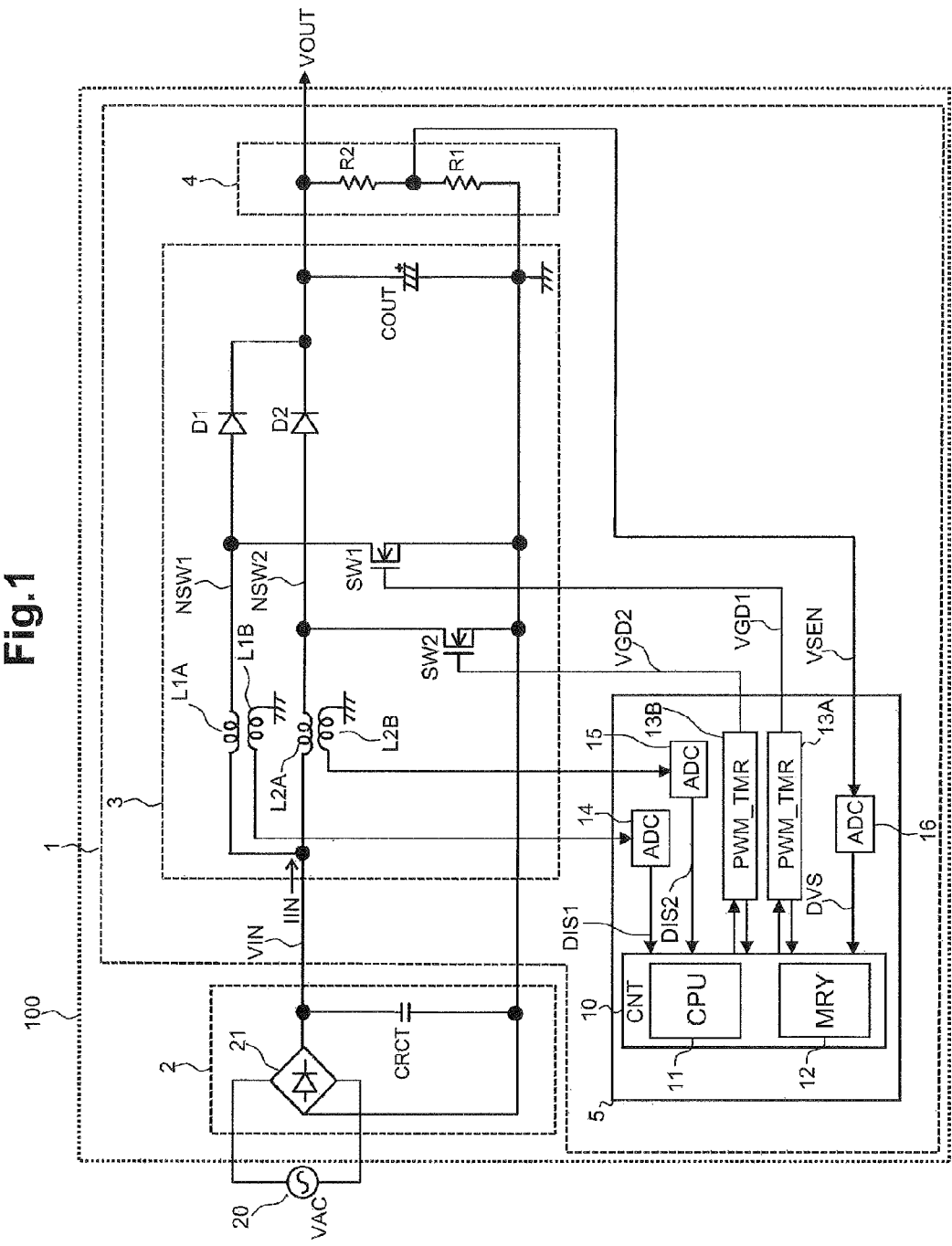
FIG. 1 is a block diagram showing an example of a switching power source device of a digital control method as an AC/DC converter according to a first embodiment.

First, typical embodiments disclosed in the present application are summarized. When referring to figures in the summary of a typical embodiment, the reference numerals in parentheses are only to illustrate those included in the concept of the components having the same reference numerals.

[1] (Switching Power Source Device for Controlling the Switching by a Pulse Signal Whose Duty Ratio is Gradually Increased at a Cycle Shorter than the PWM Cycle Just after the Start of the PWM ON Period)

A switching power source device (100, 200) according to a typical embodiment controls the current flowing through a coil (L1A, L2A) by turning on/off a switching element (SW1, SW2) by a PWM control, in order to obtain a desired DC voltage (VOUT). In the PWM ON period (TON) to turn on the switching element by the PWM control, the switching power source device is enabled to switch the switching element by a first pulse signal (T1), whose cycle is shorter than a PWM cycle (TC) based on the PWM control and whose pulse width is gradually increased, in a first period (VPLS_1) just after the start of the PWM ON period. Further, the switching power source device is enabled to control the switching of the switching element by a PWM signal (VPWM) based on the PWM control after the first period has elapsed (T2, (T3)).

According to this approach, the switching is controlled in such a way that the time for turning on the switching element is gradually increased at the start timing of the PWM ON period. Thus, as compared to the conventional approach of simply controlling the ON/OFF of the switching element by the PWM signal, it is possible to reduce a rapid current change in the coil at the start timing of the PWM ON period. In this way, it is possible to reduce the harmonic noise that is generated at the start timing of the PWM ON period.

[2] (Make the Increase Rate of the Pulse Width of the First Pulse Signal Variable by the Amount of Noise)

In the switching power source device (200) in paragraph 1, when the switching noise superimposed on the DC voltage is larger than a reference value, the increase rate of the pulse width of the first pulse signal in the first period is controlled to be reduced, and when the switching noise is smaller than the reference value, the increase rate is controlled to be increased.

According to this approach, it is possible to further reduce the harmonic noise that is generated at the start timing of the PWM ON period by the PWM control.

[3] (Decide the Pulse Width of the First Pulse Signal Based on the Last Switching Noise)

When the switching noise, which is generated due to the switching of the switching element by the last output first pulse signal in the first period, is larger than the reference value, the switching power source device in paragraph 2 makes the pulse width of the first pulse signal to be next output smaller than the reference pulse width. Further, when the switching noise is smaller than the reference value, the switching power source device makes the pulse width of the first pulse signal to be next output larger than the reference pulse width.

According to this approach, it is possible to easily achieve the control for changing the increase rate of the pulse width of the first pulse signal so that the switching noise is reduced.

[4] (Determine the Amount of Noise by the Length of the Period in which the Output Voltage is Out of a Predetermined Range)

The switching power source device in paragraph 2 or 3 determines the length of the period in which the DC voltage is out of a predetermined voltage range (W), as the magnitude of the switching noise.

According to this approach, the measurement of the magnitude of the switching noise is facilitated.

[5] (Control the Switching by the Pulse Signal Whose Duty Ratio is Gradually Increased at a Cycle Shorter than the PWM Cycle Just Before the End of the PWM ON Period)

The switching power source device in any one of paragraphs 1 to 4 is enabled to control the switching of the switching element by the PWM signal in the second period (T2) after the first period has elapsed in the PWM ON period. The switching power source device is enabled to control the switching of the switching element by the second pulse signal (VPLS), whose cycle is shorter than the PWM cycle and whose pulse width is gradually reduced, in the third period (T3) after the second period has elapsed until the PWM ON period is ended.

According to this approach, the switching of the switching element is controlled so that the time for tuning on the switching element is gradually reduced at the end timing of the PWM ON period by the PWM control. Thus, as compared to the conventional approach of simply controlling the ON/OFF of the switching element by the PWM signal, it is possible to reduce a rapid current change in the coil at the end timing of the PWM ON period. In this way, it is possible to reduce the harmonic noise that is generated at the end timing of the PWM ON period.

[6] (Make the Decrease Rate of the Pulse Width of the Second Pulse Signal Variable by the Amount of Noise)

In the switching power source device in paragraph 5, when the switching noise superimposed on the DC voltage is larger than a reference value, the decrease rate of the pulse width of the second pulse signal in the third period is controlled to be reduced. On the other hand, when the switching noise is smaller than the reference value, the decrease rate is controlled to be increased.

According to this approach, it is possible to further reduce the harmonic noise that is generated at the end timing of the PWM ON period involved in the PWM control.

[7] (Determine the Pulse Width of the Second Pulse Signal Based on the Last Switching Noise)

When the switching noise, which is generated due to the switching of the switching element by the last output second pulse signal in the third period, is larger than the reference value, the switching power source device in paragraph 6 makes the pulse width of the second pulse signal to be next output larger than the reference pulse width. On the other hand, when the switching noise is smaller than the reference value, the switching power source device makes the pulse width of the second pulse signal to be next output smaller than the reference pulse width.

According to this approach, it is possible to easily achieve the control for changing the decrease rate of the pulse width of the second pulse signal so that the switching noise is reduced.

[8] (Semiconductor Device for Outputting a Pulse Signal Whose Duty Ratio is Gradually Increased at a Cycle Shorter than the PWM Cycle Just after the Start of the PWM ON Period)

A semiconductor device (5, 7) according to a typical embodiment is a semiconductor device for controlling the ON/OFF of a switching element (SW1, SW2) in a switching power source device (100, 200), in order to convert an input voltage (VIN) into a target DC voltage (VOUT) and, at the same time, to improve the power factor. The semiconductor device includes a timer part (13A, 13B, 23A, 23B) for generating a control single (VGD1, VGD2) to control the ON/OFF of the switching element. The semiconductor device also includes a data processing control part (10) for calculating the PWM ON period (TON) to turn on the switching element in such a way that the output voltage is equal to the target DC voltage and that the phase difference between the input voltage and the input current input to the switching power source device is reduced, and at the same time, for controlling the timer part based on the calculation result. The data processing control part enables the first pulse signal (VPLS_1), whose cycle is shorter than the PWM signal (VPWM) according to the calculated PWM ON period and whose pulse width is gradually increased, to be output as the control signal in the first period (T1) just after the start of the calculated PWM ON period. Further, the data processing control part enables the PWM signal to be output as the control signal after the first period has elapsed.

According to this approach, the control signal is generated in such a way that the time for tuning on the switching element is gradually increased at the start timing of the PWM ON period of the switching element by the PWM control. Thus, the rapid change in the current through the coil can be reduced at the start timing of the PWM ON period, as compared to the conventional approach in which the semiconductor device simply generates the PWM signal to control the switching element. In this way, it is possible to reduce the harmonic noise that is generated at the start timing of the PWM ON period.

[9] (Drive the Switching Element by the Pulse Signal Whose Duty Ratio is Gradually Reduced at a Cycle Shorter than the PWM Cycle Just Before the End of the PWM ON Period)

In the semiconductor device in paragraph 8, the data processing control part enables the second pulse signal (VPLS_2), whose cycle is shorter than the PWM signal and whose pulse width is gradually reduced, to be output as the control signal in the second period just before the end of the calculated PWM ON period, by controlling the timer part.

According to this approach, the drive signal is generated in such a way that the time for turning on the switching element is gradually reduced at the end timing of the PWM ON period of the switching element by the PWM control. Thus, the rapid change in the current through the coil at the end timing of the PWM ON period can be reduced, as compared to the conventional approach in which the semiconductor device simply generates the PWM signal. In this way, it is possible to reduce the harmonic noise that is generated at the end timing of the PWM ON period.

[10] (Count the Period in which the Output Voltage is Out of a Predetermined Range to Determine the Pulse Width of the Next First Pulse Signal Based on the Count Value)

The semiconductor device (7) in paragraph 8 or 9 further includes a comparator part (142) for determining whether or not the DC voltage is out of a predetermined voltage range (W), and a timing part (143) for timing the period in which the DC voltage is out of the predetermined voltage range. When the timing result by the timing part is larger than the reference value when the switching element is switched by the last output first pulse signal in the first period, the data processing control part makes the pulse width of the first pulse signal to be next output smaller than the reference pulse width. On the other hand, when the timing result is smaller than the reference value, the data processing control part makes the pulse width of the first pulse signal to be next output larger than the reference pulse width.

According to this approach, it is possible to further reduce the harmonic noise that is generated at the start timing of the PWM ON period.

[11] (Count the Period in which the Output Voltage is Out of a Predetermined Range to Determine the Pulse Width of the Next Second Pulse Signal Based on the Count Value)

In the semiconductor device in paragraph 10, when the timing result by the timing part is larger than the reference value when the switching element is switched by the last output second pulse signal in the second period, the data processing control part makes the pulse width of the second pulse signal to be next output larger than the reference pulse width. On the other hand, when the timing result is smaller than the reference value, the data processing control part makes the pulse width of the second pulse signal to be next output smaller than the reference pulse width.

According to this approach, it is possible to further reduce the harmonic noise that is generated at the end timing of the PWM ON period.

[12] (Output the Reference PWM Signal as Well as the First and Second Pulse Signals by Switching them According to the Period)

In the semiconductor device (7) in paragraph 11, the timer part (23A, 23B) includes a first signal generation part (130) for generating the PWM signal according to the PWM ON period that is calculated by the data processing control part, and a second signal generation part (136) for generating the first and second pulse signals. The timer part further includes a signal selection part (140) for outputting the first pulse signal generated by the second signal generation part in the first period, outputting the second pulse signal generated by the second signal generation part in the second period, and outputting the PWM signal generated by the first signal generation part in the period other than the first and second periods.

This approach facilitates the generation of a control signal in such a way that the duty ratio is changed at a cycle shorter than the PWM cycle only in the first and last periods during the PWM ON period.

[13] (AC/DC Converter)

The AC/DC converter (100, 200) according to a typical embodiment includes a rectifier circuit (3) for rectifying an AC voltage (VAC) and outputting the rectified AC voltage. The AC/DC converter further includes a voltage converter circuit (3) for inputting the voltage (VIN) rectified by the rectifier circuit, converting the input voltage into a target DC voltage (VTGT) by controlling the current flowing through the coil (L1A, L2A) by the switching element (SW1, SW2), and outputting the DC voltage. Further, the AC/DC converter also includes a control part (5, 7). The control part calculates the PWM ON period (TON) to turn on the switching element in such a way that the output voltage (VOUT) of the voltage converter circuit is equal to the DC voltage and that the phase difference between the input voltage (VIN) of the voltage converter circuit and the input current (IIN) is reduced. The control part generates a control signal (VGD1, VGD2) for controlling the ON/OFF of the switching element based on the calculation result for the PWM ON period. Further, the control part is enabled to output the first pulse signal (VPLS_1), whose cycle is shorter than the PWM signal (VPWM) according to the calculated PWM ON period and whose pulse width is gradually increased, as the control signal in the first period (T1) just after the start of the PWM ON period. Further, the control part is enabled to output the PWM signal as the control signal after the first period has elapsed.

According to this approach, the switching of the switching element is controlled so that the time for turning on the switching element is gradually increased at the start timing of the PWM ON period of the AC/DC converter. Thus, as compared to the conventional approach of simply controlling the ON/OFF of the switching element by the PWM signal, it is possible to reduce a rapid current change in the coil at the start timing of the PWM ON period. In this way, it is possible to reduce the harmonic noise generated at the start timing of the PWM ON period of the AC/DC converter.

[14] (Determine the Pulse Width of the First Pulse Signal Based on the Last Generated Switching Noise)

In the AC/DC converter (200) in paragraph 13, when the switching noise, which is generated due to the switching of the switching element by the last output first pulse signal in the first period, is larger than the reference value, the control part (7) makes the pulse width of the first pulse signal to be next output smaller than the reference pulse width. When the switching noise is smaller than the reference value, the control part makes the pulse width of the first pulse signal to be next output larger than the reference pulse width.

According to this approach, it is possible to further reduce the harmonic noise that is generated at the start timing of the PWM ON period.

[15] (Control the Switching by the Pulse Signal Whose Duty Ratio is Gradually Increased at a Cycle Shorter than the PWM Period Just Before the End of the PWM ON Period)

In the AC/DC converter in paragraph 13 or 14, the control part (5, 7) is enabled to output the second pulse signal (VPLS_2), whose cycle is shorter than the PWM signal and whose pulse width is gradually reduced, as the control signal in the second period (T3) just before the end of the PWM ON period calculated as described above.

According to this approach, the drive signal is generated in such a way that the time for turning on the switching element is gradually reduced at the end timing of the PWM ON period of the switching element by the PWM control. Thus, as compared to the conventional approach in which the semiconductor device simply generates the PWM signal, it is possible to reduce the rapid current change in the coil at the end timing of the PWM ON period. In this way, it is possible to reduce the harmonic noise that is generated at the end timing of the PWM ON period.

[16] (Determine the Pulse Width of the Second Pulse Signal Based on the Last Generated Switching Noise)

In the AC/DC converter in paragraph 15, when the switching noise, which is generated due to the switching of the switching element by the last output second pulse signal in the second period, is larger than the reference value, the control part (6) makes the pulse width of the second pulse signal to be next output larger than the reference pulse width. When the switching noise is smaller than the reference value, the control part makes the pulse width of the second pulse signal to be next output smaller than the reference pulse width.

According to this approach, it is possible to further reduce the harmonic noise that is generated at the end timing of the PWM ON period.

[17] (Microcontroller)

In the AC/DC converter in paragraphs 13 to 16, the control part is configured to include a microcontroller.

2. Further Detailed Description of the Embodiments

The embodiments will be described further in detail. Note that in all of the drawings for explaining the best modes for carrying out the invention, the same reference numerals are respectively attached to components having the same function as in the drawings, and the repetitive description thereof will be omitted.

First Embodiment

FIG. 1 is a block diagram showing an example of a switching power source device of a digital control method as an AC/DC converter according to a first embodiment. A switching power source device 100 shown in this figure converts an AC power supplied from an AC power source 20 into a desired DC voltage by turning on/off a switching element SW1, SW2 by a PWM control and, at the same time, improves the power factor. The switching power source device 100 can be applied to air conditioners, automobiles, and the like, for example, as a part of the motor control system.

As described above, when the ON/OFF of the switching element is simply switched by the PWM control, a large current change occurs at the time of switching on/off the switching element, and harmonic noise is generated. Thus, the switching power source device 100 is designed to reduce the harmonic noise by controlling the respective switching elements SW1 and SW2 by a pulse signal, whose cycle is shorter than the PWM cycle and whose pulse width is gradually changed, for a short time at the start and end of the PWM ON period to turn on the switching element SW1, SW2 by the PWM control. The specific configuration of the switching power source device 100 will be described in detail below.

As shown in FIG. 1, the switching power source device 100 is configured to include a rectifier part 2 and a PFC circuit 1.

Although not specifically limited thereto, the AC power source 20 is a commercial AC power source and outputs a sine-wave AC voltage VAC (for example, 100 V) of 50 Hz or 60 Hz. The rectifier part 2 rectifies the AC voltage VAC supplied from the AC power source 20 and outputs the rectified AC voltage VAC. More specifically, the rectifier part 2 is configured to include a diode bridge circuit 21 and a capacitance CRCT. The diode bridge circuit 21 is a full-wave rectifier circuit that is configured, for example, by combining a plurality of diodes. The positive voltage rectified by the diode bridge circuit 21 is smoothed by the capacitance CRCT.

The PFC circuit 1 is a critical mode PFC circuit. For example, the PFC circuit 1 is configured to include a voltage converter circuit 3, an output voltage detection part 4, and a control part 5.

The voltage converter circuit 3 inputs the voltage rectified by the rectifier circuit 2, controls the current flowing through the coil by the switching element, converts the input voltage VIN into a target DC voltage, and outputs the DC voltage. Although not specifically limited thereto, the voltage converter circuit 3 is configured to realize an interleaved boost PFC circuit with redundant coils, switching elements, and the like. For example, the voltage converter circuit 3 is configured to include coils L1A, L1B, L2A, and L2B, switching elements SW1 and SW2, rectifier elements D1 and D2, and an output capacitance COUT. For example, the voltage converter circuit 3 converts a 100 V rectified voltage into a 300 V DC voltage.

Hereinafter, the input voltage of the voltage converter circuit 3 is denoted by reference symbol VIN, the output voltage is denoted by reference symbol VOUT, and the input current of the voltage converter circuit 3 is denoted by reference symbol INN. Further, it is assumed that each reference symbol denoting each voltage, such as reference VIN or VOUT, also indicates the node to which the particular voltage is supplied.

An end of the coil L1A is coupled to a node VIN and the other end is coupled to a node NSW1. The coil L1B is a circuit element for detecting the current flowing through the coil L1A, and is arranged to be magnetically coupled to the coil L1A. An end of the coil L2A is coupled to the node VIN and the other end is coupled to a node NSW2. The coil L2B is a circuit element for detecting the current flowing through the coil L2A, and is arranged to be magnetically coupled to the coil L2A.

The switching element SW1 is provided between the node NSW1 and a ground node. The switching element SW1 controls the current flowing through the coil L1A. The switching element SW2 is provided between the node NSW2 and the ground node. The switching element SW2 controls the current flowing through the coil L2A. Although not specifically limited thereto, for example, the switching element SW1, SW2 is a high-voltage MOS transistor, IGBT (Insulated Gate Bipolar Transistor), or the like. The figure shows an example of the case when the switching element SW1, SW2 is realized by an n-channel MOS transistor.

The ON/OFF of the switching element SW1 is controlled by the control voltage VGD1 output from the control part 5. The ON/OFF of the switching element SW2 is controlled by the control voltage VGD2 output from the control part 5. For example, the switching element SW1 is turned on when the control voltage VGD1 is at a first logic level (for example, High level), and is turned off when the control voltage VGD1 is at a second logic level (for example, Low level). The mechanism is the same with the switching element SW2. Note that FIG. 1 illustrates a configuration in which the switching of the switching element SW1, SW2 is directly controlled by the control voltage VGD1, VGD2 from the control part 5. However, it is also possible to configure in such a way that a gate driver circuit is provided between the switching element SW1, SW2 and the control part 5 to control the switching of the switching element SW1, SW2 through the gate driver circuit.

The rectifier element D1 is provided between the node NSW1 and the output node VOUT to form a current path between the node NSW1 and the output node VOUT during the period when the switching element SW1 is turned off. The rectifier element D2 is provided between the node NSW2 and the output node VOUT to form a current path between the node NSW2 and the output node VOUT during the period when the switching element SW2 is turned off. The rectifier element D1, D2 is, for example, a diode with the anode coupled to the side of the node NSW1 (NSW2) and the cathode coupled to the side of the output node VOUT. The output capacitance COUT is coupled between the output node VOUT and the ground node to stabilize the output voltage VOUT.

The output voltage detection part 4 detects the output voltage VOUT and supplies a detection voltage VSEN to the control part 5. For example, the output voltage detection part 4 is configured to include resistances R1 and R2 coupled in series between the output node VOUT and the ground node. The voltage obtained by the output voltage VOUT by the resistances R1 and R2 is defined as the detection voltage VSEN. The resistance ratio R1/R2 is set, for example, to "1/59" in order to generate the detection voltage VSEN of "5 V" from the output voltage VOUT of "300 V". Note that in this figure, the output voltage detection part 4 is provided on the outside of the control part 5. However, the output voltage detection part 4 can be included in the control part 5.

The control part 5 generates the control voltage VGD1 and VGD2 in such a way that the output voltage VOUT of the voltage converter circuit 3 is equal to the target voltage and that the phase difference between the input voltage VIN and the input current IIN is reduced. Although not specifically limited thereto, the control part 5 is configured by a semiconductor integrated circuit formed in a semiconductor substrate, such as of single crystalline silicon, by using known CMOS integrated circuit manufacturing techniques. The control part 5 is, for example, a program processor such as micon (MCU) or DSP (Digital Signal Processor). Note that the control part 5 may be realized in a single-chip configuration as described above or may be realized in a multi-chip configuration. There is no particular limitation in the configuration.

For example, the control part 5 is configured to include A/D conversion parts (ADC) 14 to 16, a data processing control part (CNT) 10, PWM timer parts (PWM_TMR) 13A and 13B, an external interface circuit not shown, and the like.

The A/D conversion part 16 generates a conversion result DVS, for example, by sampling the detection voltage VSEN in response to an A/D conversion start signal output from the PWM timer part 13A, 13B, and by converting the sampled voltage into a digital signal according to the condition set by the data processing control part 10. In this way, the information of the output voltage VOUT can be obtained.

The A/D conversion part 14 generates a conversion result DIS1, for example, by sampling the current flowing through the coil L1B magnetically coupled to the coil L1A in response to an A/D conversion start signal output from the PWM timer part 13A, and by converting the sampled current into a digital signal according to the condition set by the data processing control part 10. In this way, the information of the current flowing through the coil L1A can be obtained. Similarly, the A/D conversion part 15 generates a conversion result DIS2, for example, by sampling the current flowing through the coil L1B in response to an A/D conversion start signal output from the PWM timer part 13B, and by converting the sampled current into a digital signal. In this way, the information of the current flowing through the coil L2A can be obtained.

The data processing control part 10 performs various arithmetic operations to provide an overall control of the respective functional parts in the control part 5. For example, the data processing control part 10 is configured to include a CPU 11 and a memory part (MRY) 12. The memory part 12 includes a non-volatile memory (for example, ROM (Read Only Memory), a flash memory, and the like) or volatile memory (RAM: Random Access Memory) in which programs are stored, various registers, and the like. The CPU 11 executes programs stored in the RAM, or the like, to achieve various arithmetic operations and controls.

The data processing control part 10 performs the arithmetic operations to determine the pulse width of the control signals VGD1 and VGD2, based on the conversion results DIS1 and DIS2 from the A/D conversion parts 14 to 16. Then, the data processing control part 10 generates the desired control signals VGD1 and VGD2 by controlling the PWM timer part 13 based on the operation results. More specifically, the data processing control part 10 calculates the PWM ON period to turn on the switching element SW1, SW2 in such a way that the output voltage VOUT is equal to the target voltage VTGT and that the phase difference between the input voltage VIN and the input current IIN is reduced. Then, the data processing control part 10 sets the control condition according to the calculation result into the PWM timer part 13.

More specifically, the data processing control part 10 calculates the difference between the current value of the output voltage VOUT and the target voltage VTGT based on the conversion result DVS from the A/D conversion part 16. Then, the data processing control part 10 determines the PWM ON period TON to turn on the switch element SW1, SW2 so that the difference is reduced. For example, when the output voltage VOUT is smaller than the target voltage VTGT, the data processing control part 10 raises the output voltage VOUT by increasing the PWM ON period TON. On the other hand, when the output voltage VOUT is larger than the target voltage VTGT, the data processing control part 10 lowers the output voltage VOUT by reducing the PWM ON period of the switch element SW1, SW2. Further, the data processing control part 10 monitors the current flowing through the coil L1A based on the conversion result DIS1 from the A/D conversion part 14. Then, the data processing control part 10 detects the timing when the current becomes zero (0) and determines the timing to turn on the switch element SW1. Similarly, the data processing control part 10 monitors the current flowing through the coil L2A based on the conversion result DIS2 from the A/D conversion part 15. Then, the data processing control part 10 detects the timing when the current becomes zero and determines the timing to turn on the switch element SW2.

The data processing control part 10 determines the control condition to generate the desired PWM signal based on the PWM ON period TON that is calculated as described above, and based on the timing to turn on the switching element SW1, SW2 determined as described above. Then, the data processing control part 10 sets the control condition to the PWM timer part 13A, 13B.

The PWM timer part 13A generates the control signal VGD1 according to the control condition set by the data processing control part 10. Similarly, the PWM timer part 13B generates the control signal VGD2 according to the control condition set by the data processing control part 10.

Note that in the present embodiment, the PWM timer part 13A and the PWM timer part 13B have the same circuit configuration, in which the respective operations (the count operation by the counter, the update of various registers, or other operations) are controlled at the timing delayed by a half cycle (timing at which the phase is displaced by $\pi$). In this way, the generated control signal VGD1 and the generated control signal VGD2 are the signals whose phases are displaced from each other by "$\pi$".

Figure 2:
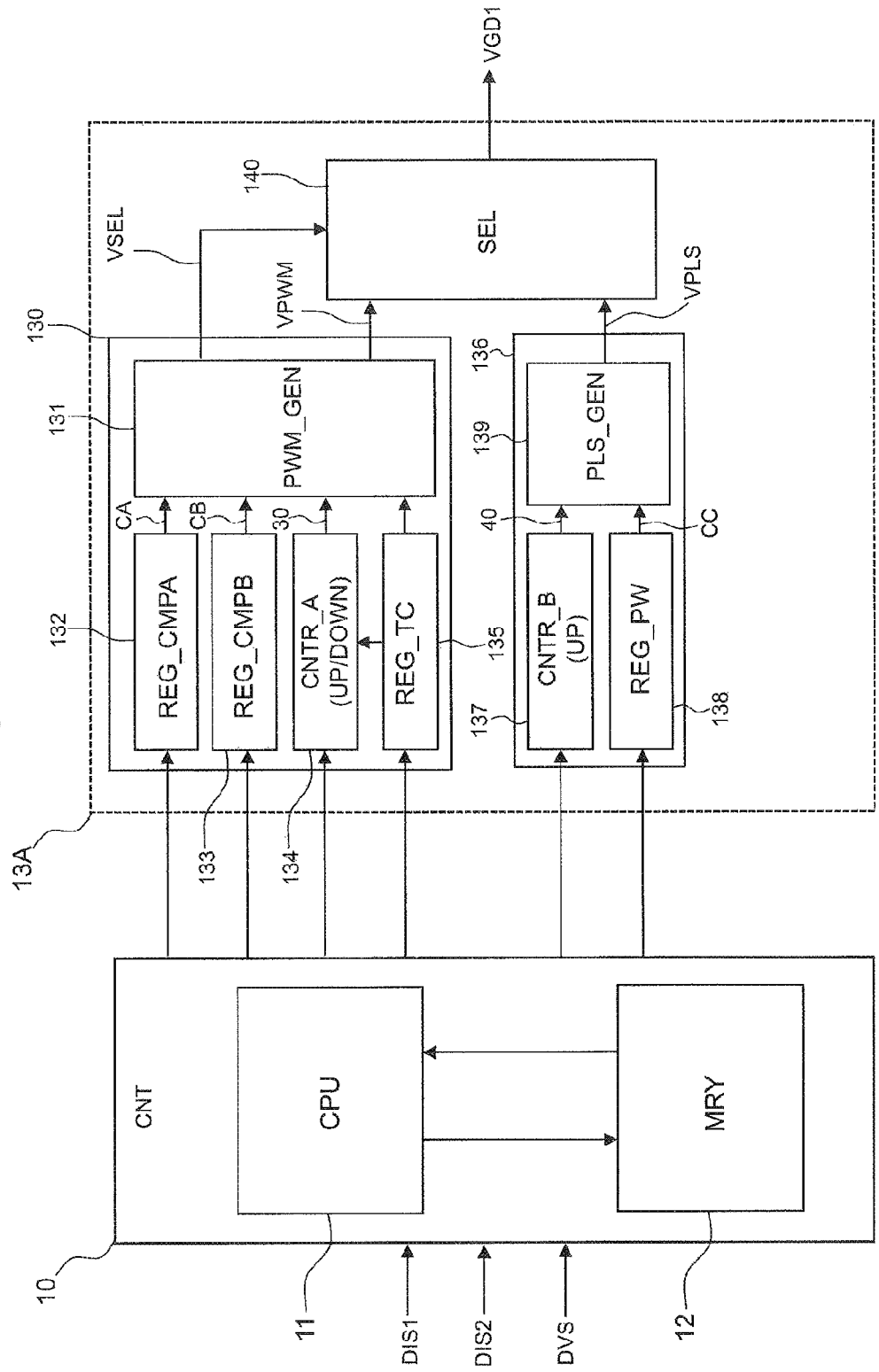
FIG. 2 is a block diagram showing an example of the internal configuration of a PWM timer part according to the first embodiment.

FIG. 2 shows an example of the internal configuration of the PWM timer part 13A. Note that, as described above, the PWM timer 13B has the same configuration as that of the PWM timer 13A, so that the PWM timer 13A will be described in detail as a representative example.

As shown in the figure, the PWM timer part 13A includes, as operation parts, a base PMW signal generation part 130, a pulse signal generation part 136, and a selection part (SEL) 140.

The base PMW signal generation part 130 generates a signal VPWM with the pulse width modulated according to the control condition set by the data processing control part 10. The base PWM signal generation part 130 includes, for example, a signal generation circuit (PWM_GEN) 131, a compare register (REG_CMPA) 132, a compare register (REG_CMPB) 133, a PWM cycle setting register (REG_TC) 135, and a counter circuit (CNTR_A) 134.

The specified value of the PWM cycle TC based on the PWM control is set to the PWM cycle setting register 135 by the data processing control part 10. Although not specifically limited thereto, the PWM cycle TC is set between tens of $\mu$s to hundreds of $\mu$s, and the base PWM signal VPWM is a signal of, for example, between several kHz and tens of kHz.

The counter circuit 134 performs a count operation to count the input reference clock signal according to the set value of the PWM cycle setting register 135. The start and stop of the count operation by the counter circuit 134 is controlled by an instruction from the data processing control part 10. For example, the counter circuit 134 operates as an up-down counter that repeats up count and down count with the cycle TC (tens of $\mu$s to hundreds of $\mu$s) specified by the PWM cycle setting register 135. A count value 30 of the counter circuit 134 has a cycle of a fixed triangular waveform. Note that the reference clock signal to be counted by the counter circuit 134 is supplied, for example, from the clock signal generation part, not shown, provided on the inside or outside of the control part 5. The oscillating frequency is, for example, in the range from several MHz to tens of MHz.

The specified value of the PWM ON period calculated by the data processing control part 10, namely, the specified value of the duty ratio of the base PWM signal VPWM is set to the compare register 132. The specified value indicating the length of the period T1, T3 in which the pulse signal VPLS is output, which will be described below, is set to the compare register 133. The set value of the compare register 132 is represented by "CA", and the set value of the compare register 133 is represented by "CB". Note that CA<CB.

The signal generation circuit 131 generates the base PWM signal VPWM by comparing the count value 30 of the counter circuit 134 with the respective set values of the various registers 132, 133, and 134. At the same time, the signal generation circuit 131 outputs the selection signal VSEL as well as the A/D conversion start signal with respect to the A/D conversion part 14, 16.

More specifically, the signal generation circuit 131 changes the base PWM signal VPWM, for example, to a low level in the period in which the count value 30 of the counter circuit 134 is smaller than the set value CA of the compare register 132. Then, the signal generation circuit 131 changes the base PWM signal VPWM, for example, to a high level in the period in which the count value 30 is larger than the set value CA of the compare register 132. In this way, the base PWM signal VPWM of the duty ratio (PWM ON period TON) according to the set value CA of the compare register 132 is generated. Further, the signal generation circuit 131 asserts the selection signal VSEL (for example, high level) in the period in which the count value 30 of the counter circuit 134 is larger than the set value CA of the compare register 132 and is smaller than the set value CB of the compare register 133. Then, the signal generation circuit 131 negates the selection signal VSEL (for example, low level) in the period in which the count value 30 is larger than the set value CB of the compare register 133.

The pulse signal generation part 136 generates the pulse signal VPLS whose cycle is shorter than the PWM cycle TC and whose pulse width is gradually changed, according to the control condition set by the data processing control part 10. The pulse signal generation part 136 includes, for example, a counter circuit (CNTR_B) 137, a pulse width setting register (REG_PW) 138, and a signal generation circuit (PLS_GEN) 139.

The counter circuit 137 performs the count operation to count the input reference clock signal according to the condition set by the data processing control part 10. For example, the counter circuit 137 operates as an up counter that repeats the operation of counting up to the specified value set by the data processing control part 10, clearing the count value, and counting up again to the specified value. At this time, the count value has a cycle of a fixed saw tooth waveform. The count cycle of the counter circuit 137 is made smaller than the count cycle (PWM cycle TC) of the counter circuit 134. Note that the reference clock signal to be counted by the counter circuit 137 is supplied from the clock signal generation part, not shown, similarly to the counter circuit 134.

The value specifying the pulse width (duty ratio) of the pulse signal VPLS is set to the pulse width setting register 138. Hereinafter, the set value of the pulse width setting register 138 is represented by "CC".

The signal generation circuit 139 generates the pulse signal VPLS by comparing a count value 40 of the counter circuit 137 with the set value CC of the pulse width setting register 138. For example, the signal generation circuit 139 changes the pulse signal VPLS, for example, to a high level when the count value 40 of the counter circuit 137 is smaller than the set value CC. On the other hand, the signal generation circuit 139 changes the pulse signal VPLS, for example, to a low level when the count value 40 is larger than the set value CC. In this way, the pulse signal VPLS of the duty ratio according to the set value CC of the pulse width setting register 138 is generated. The set value CC of the pulse width setting register 138 is sequentially updated for each count cycle of the counter circuit 137 by the data processing control part 10, which will be described in detail below.

The selection part 140 selects either of the base PWM signal VPWM and the pulse signal VPLS, and outputs the selected signal as the control signal VGD1. For example, the selection part 140 outputs the pulse signal VPLS as the control signal VGD1 during the period in which the selection signal VSEL is asserted. On the other hand, the selection part 140 outputs the base PWM signal VPWM as the control signal VGD1 during the period in which the selection signal VSEL is negated.

Figure 3:
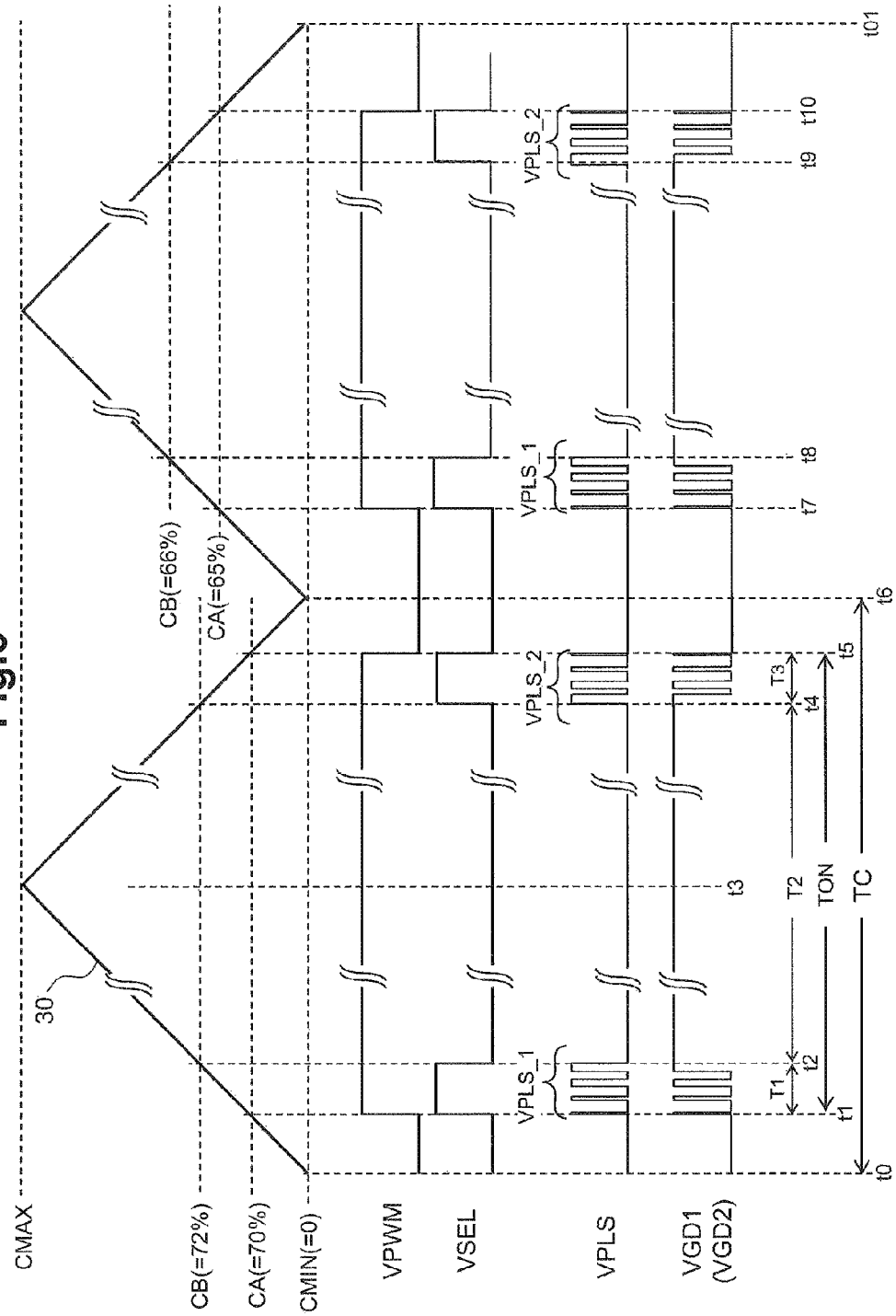
FIG. 3 shows an example of a timing chart of various signals generated by the PWM timer part 13A.

FIG. 3 shows an example of the timing chart of various signals generated by the PWM timer part 13A. The figure shows the control signal VGD1 for two cycles. It is illustrated that the duty ratio of the base PWM signal (the PWM ON period TON based on the PWM control) is set to 70% for the first one cycle, and that the duty ratio of the base PWM signal is set to 65% for the next one cycle.

As shown in the figure, when the data processing control part 10 provides a count operation start instruction to the counter circuit 134 at time t0, the counter circuit 134 starts the up count. Then, at time t1 when the count value 30 of the counter circuit 134 matches the set value CA (for example, the value with respect to the duty ratio 70% of the base PWM signal VPWM) of the compare register 132, the signal generation circuit 131 switches the base PWM signal VPWM from the low level to the high level. At the same time, the signal generation circuit 131 asserts the selection signal VSEL (for example, the signal generation circuit 131 changes the selection signal VSEL to the high level).

Next, at time t2 when the count value 30 of the counter circuit 134 matches the set value CB of the compare register 133, the signal generation circuit 131 negates the selection signal VSEL (for example, the signal generation circuit 131 changes the selection signal VSEL to the low level) while keeping the base PWM signal VPWM at the high level. Note that the figure illustrates the case in which the set value CB of the compare register 133 is set to a value corresponding to a duty ratio of 72% that is larger than the set value CA (duty ratio of 70%), but is not particularly limited thereto. The set value CB of the compare register 133 can be changed according to the magnitude of the potential switching noise. For example, when it is assumed that the switching noise is large, the set value CB is set, for example, to a value corresponding to a duty ratio of 73%. When it is assumed that the switching noise is small, the set value CB is set, for example, to a value corresponding to a duty ratio of 71%.

Meanwhile, the pulse signal VPLS is generated by the pulse signal generation part 136 in the time period T1 from time t1 to time t2.

More specifically, in the time period T1, the counter circuit 137 repeatedly performs the up count operation. Then, the set value of the pulse width setting register 138 is updated for each count cycle of the counter circuit 137. For example, the set value CC of the pulse width setting register 138 is updated so that the duty ratio of the pulse signal VPLS is gradually increased to 10%, 30%, 50%, 70%, and so on. In this way, the pulse signal VPLS_1, whose cycle is shorter than the PWM cycle TC and whose pulse width is gradually increased, is generated in the time period T1.

Here, the specific method for generating the pulse signal VPLS will be described in detail with reference to FIG. 4.

Figure 4:
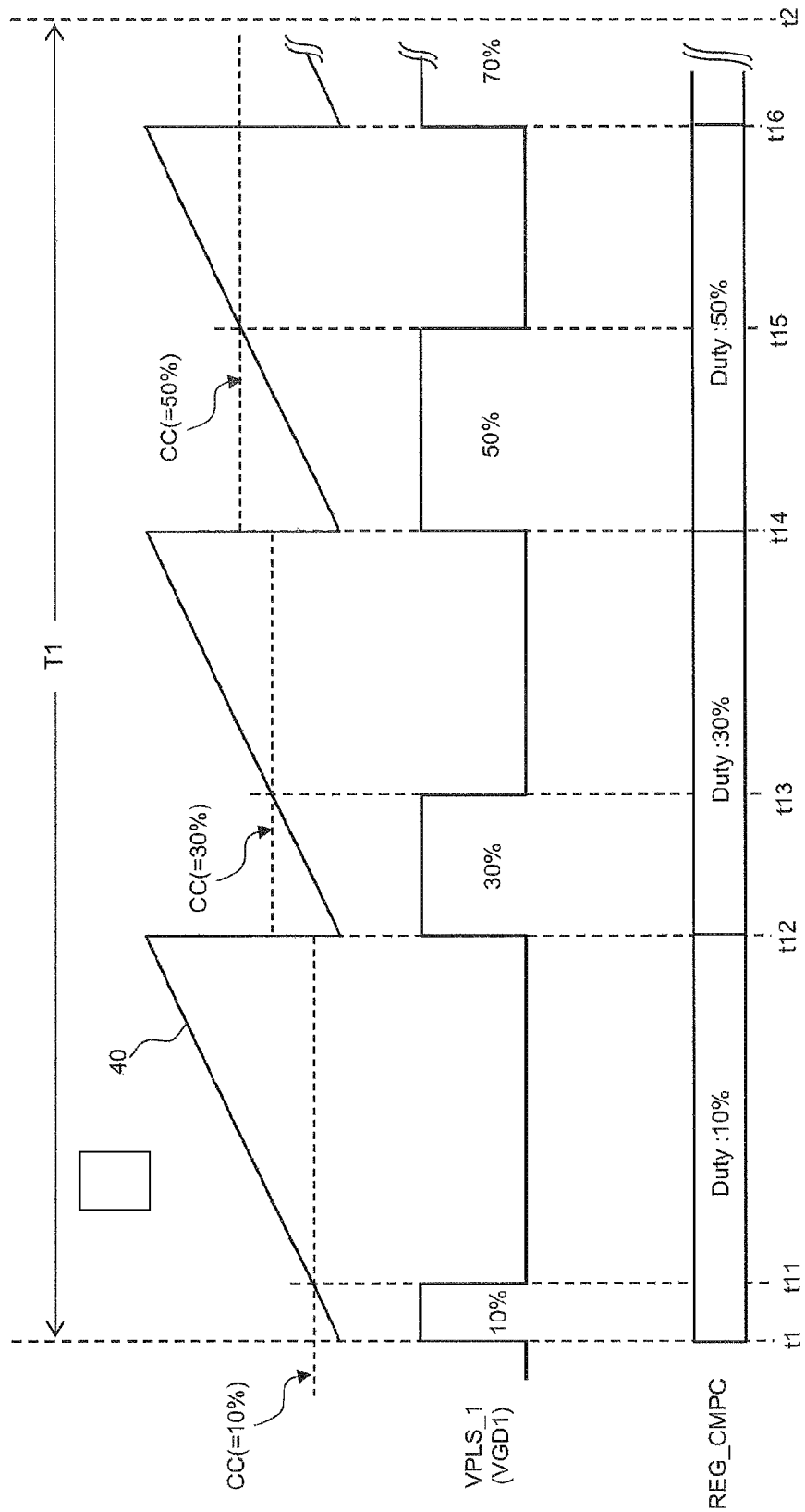
FIG. 4 is a diagram showing an example of a timing chart of a pulse signal VPLS_1 generated by the PWM timer part according to the first embodiment.

FIG. 4 is a diagram showing an example of the timing chart of the pulse signal VPLS_1 generated by the PWM timer part according to the first embodiment. The figure illustrates the update timing of various signals and registers in the time period T1 from time t1 to time t2 in FIG. 3. Note that, in the figure, it is assumed that the value specifying a duty ratio of 10% is set as the default value for the set value CC of the pulse width setting register 138.

As shown in the figure, when the data processing control part 10 provides a count operation start instruction to the counter circuit 137, the counter circuit 137 starts the count operation. At this time, since the count value 40 of the counter circuit 137 is lower than the set value CC of the pulse width setting register 138, the pulse signal VPLS is changed to the high level. Then, when the count value 40 of the counter circuit 137 matches the set value CC of the pulse width setting register 138 at time t11, the pulse signal VPLS is changed to the low level. After that, when the count value of the counter circuit 137 reaches the maximum value at time t13, the count value of the counter circuit 137 is cleared and the counter circuit 137 starts the up count again. In this way, the pulse signal VPLS_1 whose cycle is the same as the count cycle of the counter circuit 137 and whose duty ratio is 10% is generated in the period from time t1 to time t3.

The set value CC of the pulse width setting register 138 is updated, for example, at the timing when the count value of the counter circuit 137 is cleared. For example, the following two methods can be considered as methods for updating the set value CC of the pulse width setting register 138. A first control method is, for example, a method that the data processing control part 10 directly changes the set value CC of the pulse width setting register 138 in synchronization with timing t13 when the count value of the counter circuit 137 is reset. A second control method is, for example, a method that a buffer register (not shown) capable of temporarily storing data is provided in the pulse signal generation part 136, in order to set a value to the pulse width setting register 138 through the buffer register. For example, the data processing control part 10 first sets a specified value of the pulse width (for example, a duty ratio of 30%) to the buffer register at a predetermined timing before the count value of the counter circuit 137 is reset. Then, the value of the buffer register is loaded into the pulse width setting register 138 at timing t13 at which the count value 40 is reset. An example of the predetermined timing is, for example, the timing when the count value 40 of the counter circuit 137 matches the intermediate value (the count value corresponding to a duty ratio of 50% of the pulse signal VPLS_1) CM. According to the control method described above, it is possible to change the duty ratio for each cycle of the pulse signal VPLS.

When the count value 40 is reset at time t13 and when the set value of the pulse width setting register 138 is updated, the pulse signal VPLS is changed to the high level again. Then, when the count value 40 of the counter circuit 137 matches the set value CC (duty ratio of 30%) of the pulse width setting register 138 at time t14, the pulse signal VPLS is changed to the low level. In this way, the pulse signal VPLS_1 with a duty ratio of 30% is generated. Then, when the count value 40 is reset at time t15, the set value CC of the pulse width setting register 138 is updated from the duty ratio of 30% to the duty ratio of 50%. The following operations are the same as the operations from time t13 to t16.

The control of the pulse signal generation part 136 as described above allows the generation of the pulse signal VPLS_1, whose cycle is shorter than the PWM cycle TC and whose pulse width is gradually increased, in the time period T1 just after the start of the PWM ON period TC in the PWM cycle TC.

Now return to FIG. 3 again, the control after time t3 will be described.

At time t3, the count value 30 of the counter circuit 134 reaches the maximum value CMAX, and the counter circuit 134 switches from the up count to the down count. Then, when the count value 30 of the counter circuit 134 matches the set value CB of the compare register 133 again at time t4, the signal generation circuit 131 asserts the selection signal VSEL (the signal generation circuit 131 changes the selection signal VSEL to the high level) while keeping the base PWM signal VPWM at the high level. When the count value 30 of the counter circuit 134 matches the set value CA (=a1) of the compare register 132 at time t5, the signal generation circuit 131 switches the base PWM signal VPWM from the high level to the low level. At the same time, the signal generation circuit 131 negates the selection signal VSEL (the signal generation circuit 131 changes the selection signal VSEL to the low level).

Meanwhile, the pulse signal VPLS is generated in the time period T3 from time t4 to time t5. More specifically, when the data processing control part 10 provides a count start instruction to the counter circuit 137 at time t4, the counter circuit 137 starts the count operation. Further, the data processing control part 10 sets a value (for example, a duty ratio of 70%) that specifies the pulse width to the pulse width setting register 138 at time t4. The signal generation circuit 139 compares the count value 40 of the counter circuit 137 with the set value CC of the pulse width setting register 138. Then, the signal generation circuit 139 changes the pulse signal VPLS, for example, to the high level during the period in which the count value 40 is smaller than the set value CC of the pulse width setting register 138. Further, the signal generation circuit 139 changes the pulse signal VPLS, for example, to the low level during the period in which the count value 40 is larger than the set value CC. In this way, the pulse signal VPLS according to the set value CC (for example, the duty ratio of 70%) of the pulse width setting register 138 is generated. After that, the counter circuit 137 repeats the count operation until the count value 30 of the counter circuit 134 and the set value CA (=b1) of the compare register 132 match each other. During this period of time, the data processing control part 10 repeats the update of the set value CC of the pulse width setting register 138 at the timing according to the count cycle of the counter circuit 137. For example, the data processing control part 10 updates the value specifying the pulse width of the pulse signal VPLS in such a way that the duty ratio of the pulse signal VPLS is gradually reduced to 70%, 50%, 30%, 10%, and so on. In this way, the pulse signal VPLS_2, whose cycle is shorter than the PWM cycle TC and whose pulse width is gradually reduced, is generated in the time period T3 from time t4 to time t5. Note that the specific generation method of the pulse signal VPLS_2 is the same as the generation method (FIG. 4) of the pulse signal VPLS_1 described above.

The selection part 140 outputs the pulse signal VPLS as the control signal VGD1 in the time period T1 from time t1 to t2 as well as the time period T3 from time t4 to t5, during which the selection signal VSEL is asserted. Then, the selection part 140 outputs the base PWM signal VPWM as the control signal VGD1 in the time period T2 from time t2 to t4 during which the selection signal VSEL is negated.

When the count value 30 is changed to the minimum value CMIN (=0) at time t6, the generation of the control signal VGD1 for one cycle is completed. Then, when the counter circuit 134 starts the count operation again, the generation of the control signal VGD1 for the next one cycle is started. The control after time t6 is the same as the control content from time t1 to t5, except the point at which the respective set values of the compare registers 132 and 133 are set to 65% and 66% duty ratios of the base PWM signal VPWM.

By controlling the PWM timer part 13A as described above, the pulse signals VPLS_1 and VPLS_2, whose cycles are shorter than the PWM cycle TC and whose pulse widths are gradually changed, are output as the control signal VGD1 for the short times of T1 and T3 at the start and end of the PWM ON period TON. The base PWM signal VPWM is output as the control signal VGD1 in the other period T2 in the PWM ON period TON. Note that the PWM timer part 13B is different from the PWM timer part 13A only in the timing of the control, and their control contents are the same. Thus, the control signal VGD2 is generated in the same way as the control signal VGD1.

Figure 5:
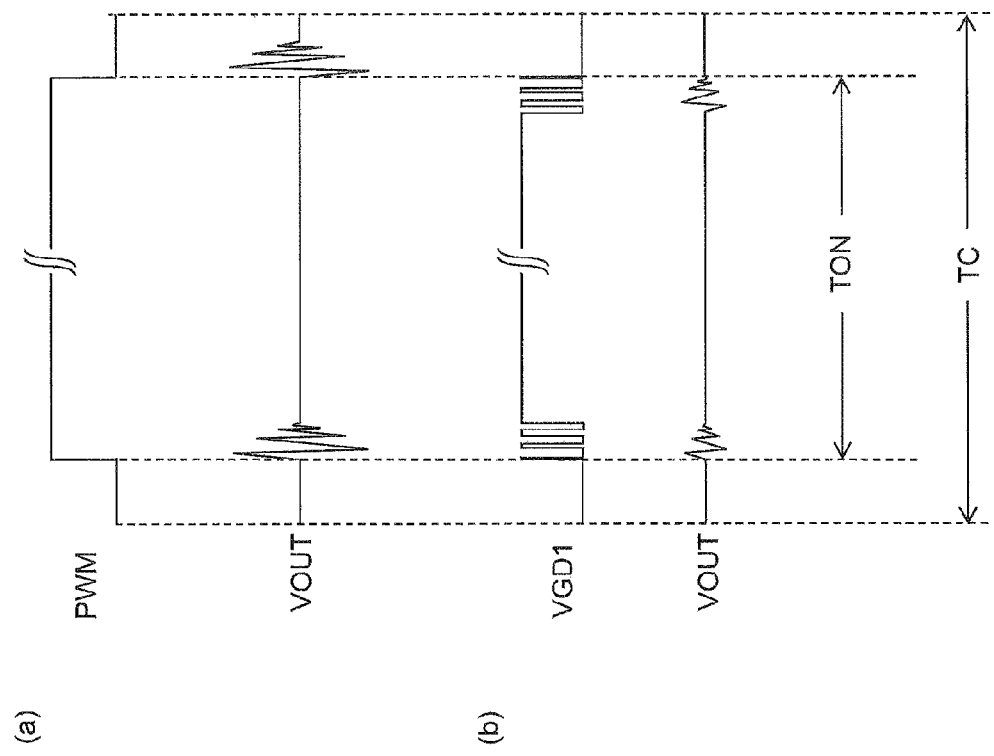
FIG. 5 is a diagram showing an example of the effect of reducing harmonic noise by the switching power source device according to the first embodiment.

FIG. 5 illustrates the reduction effect of the switching noise by the switching power source device 100 according to the present embodiment. Part (a) of the figure shows a waveform example of the output voltage VOUT when the switching element is simply driven by the PWM signal as that in the conventional switching power source device. Part (b) of the figure shows a waveform example of the output voltage VOUT of the switching power source device 100 according to the present embodiment.

As shown in the figure, with the switching power source device according to the present embodiment, it is possible to reduce the switching noise by driving the switching element by the pulse signal VPLS whose pulse width is gradually switched for a short period at the start and end of the PWM ON period TON in the PWM cycle TC. As a result, it is possible to reduce the harmonic noise in the switching power source device.

Second Embodiment

Figure 6:
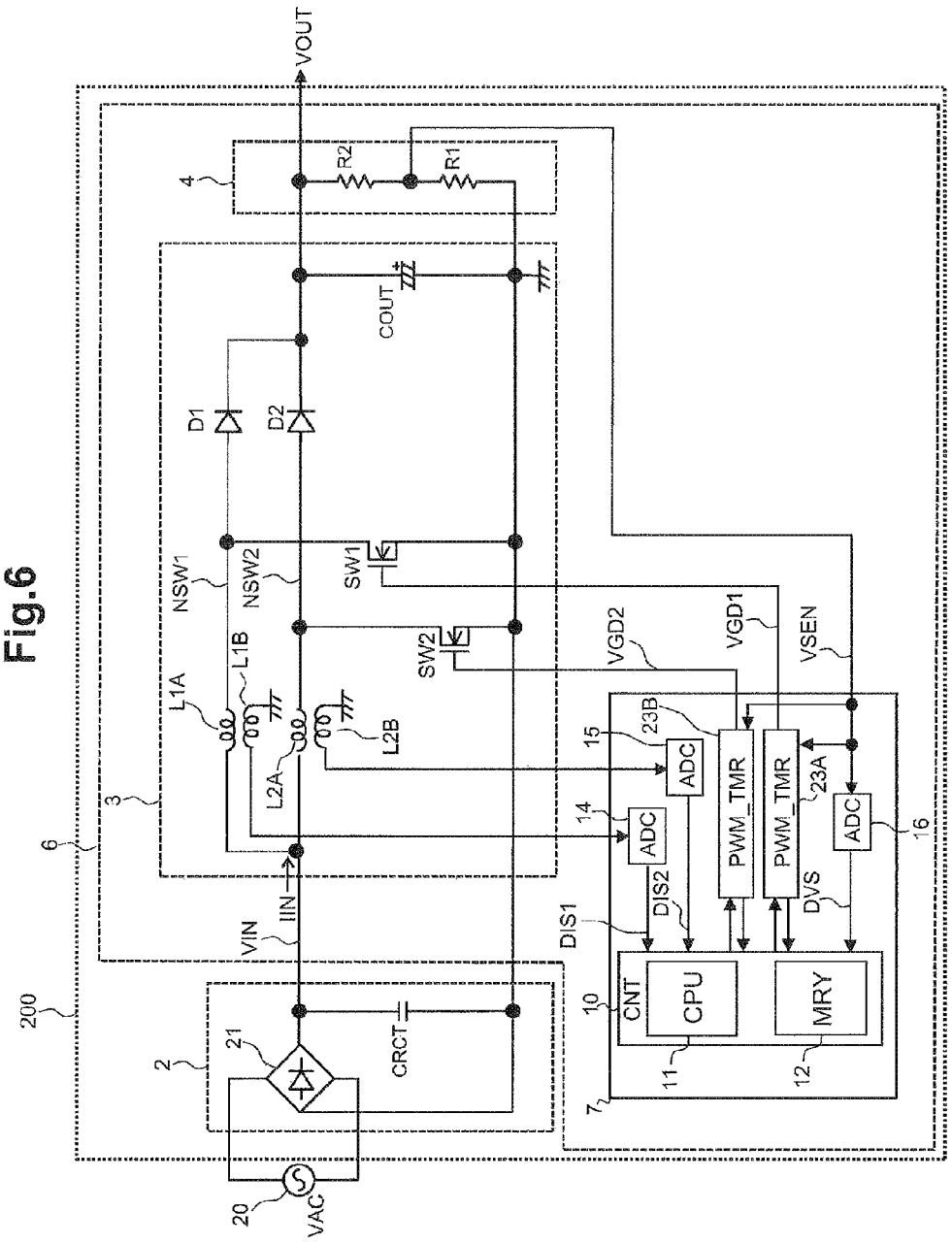
FIG. 6 is a block diagram showing an example of the switching power source device of the digital control method as an AC/DC converter according to a second embodiment.

FIG. 6 is a block diagram illustrates a switching power source device of the digital control method as an AC/DC converter according to a second embodiment.

A switching power source device 200 shown in the figure is different from the switching power source device 100 according to the first embodiment in having a function to change the pulse width of the pulse signal VPLS according to the magnitude of the noise superimposed on the output voltage VOUT. Note that of the components of the switching power source device 200, the same components as those of the switching power source device 100 are designated by the same reference numerals and the detailed description thereof will be omitted.

In a PFC circuit 6 shown in FIG. 6, a PWM timer 23A, 23B within a control part 7 also includes a function to detect the noise superimposed on the output voltage VOUT of the switching power source device 200 by monitoring the detection voltage VSEN. Note that in the present embodiment, it is assumed that the PWM timer part 23A and the PWM timer part 23B have the same circuit configuration, and the PWM timer part 23A will be described in detail as a representative example.

Figure 7:
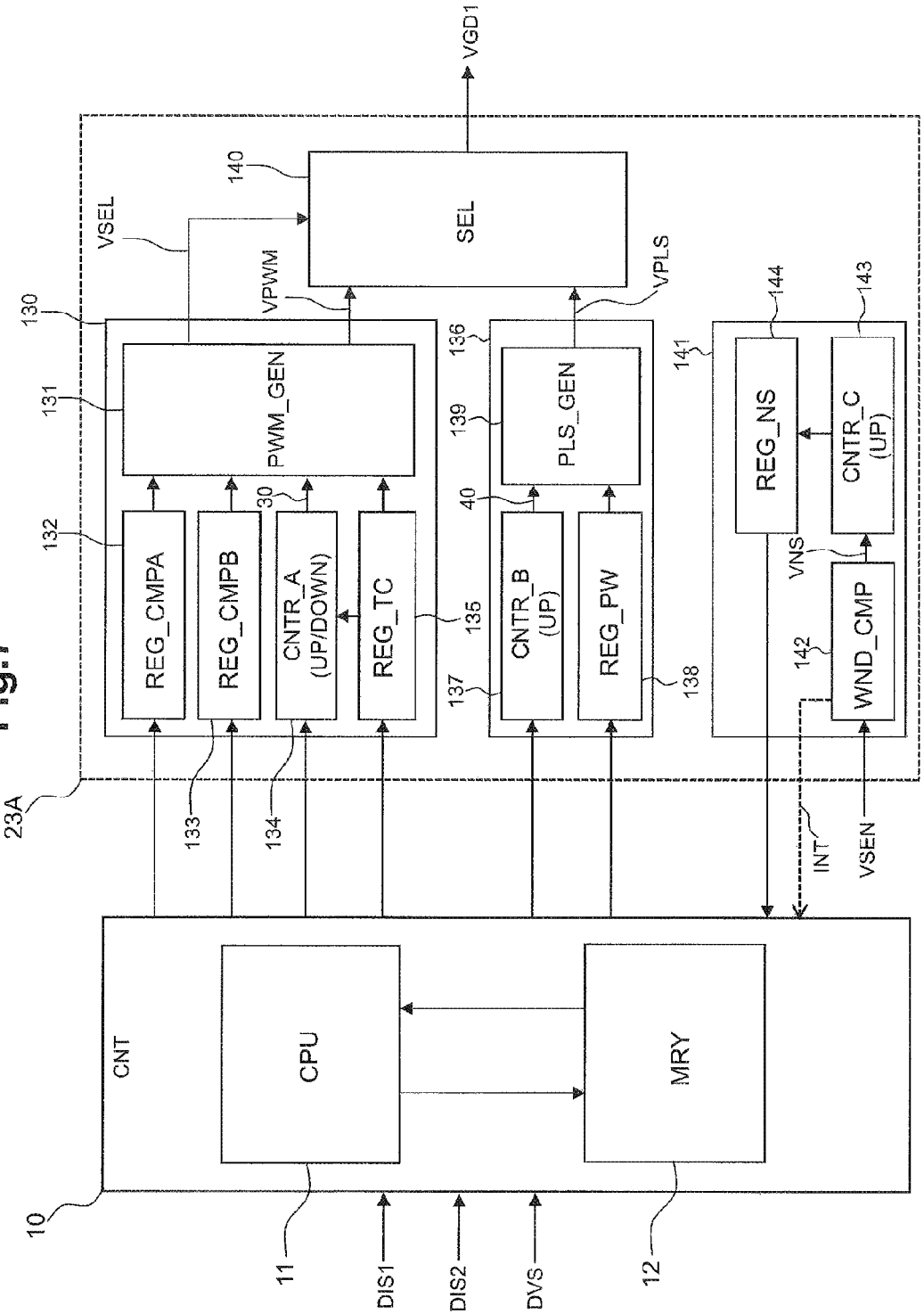
FIG. 7 is a block diagram showing an example of the internal configuration of the PWM timer part according to the second embodiment.

FIG. 7 is a block diagram showing an example of the internal configuration of the PWM timer part 23A. As shown in the figure, the PWM timer part 23A includes a noise detection part 141, in addition to the base PWM signal generation part 130, the pulse signal generation part 136, and the selection part (SEL) 140 as the functional parts to generate the control signal VGD1.

The noise detection part 141 includes a wind comparator part (WND_CMP) 142, a counter circuit (CNTR_C) 143, and a noise detection result register (REG_NS) 144.

The wind comparator part 142 determines whether or not the detection voltage VSEN is within a predetermined voltage range W, and then outputs a determination result signal VNS. More specifically, the wind comparator part 142 determines that the noise is not superimposed on the output voltage VOUT when the detection voltage VSEN is within the predetermined voltage range W. Then, the wind comparator part 142 outputs the determination result signal VNS to change the signal level, for example, to the low level. On the other hand, when the detection voltage VSEN is out of the predetermined voltage range W, the wind comparator part 142 determines that the noise is superimposed on the output voltage VOUT and outputs the determination result signal VNS to change the signal level, for example, to the high level. For example, the voltage range W is defined as the voltage range around the target voltage (for example, 300 V) of the output voltage VOUT of the switching power source device 200. The voltage range W provides an indication of whether or not the noise is superimposed on the output voltage VOUT. The voltage range W can be programmably varied and is determined, for example, based on the amount of change in the allowable output voltage VOUT for the system to which the switching power source device 200 is applied.

The counter circuit 143 times the period in which the noise is superimposed on the output voltage VOUT. More specifically, the counter circuit 143 starts the up count when the determination result indicating that the noise is superimposed is output from the wind comparator part 142 (for example, when the determination result signal VNS is changed to the high level). Then, the counter circuit 143 stops the up count and clears the count value when the determination result indicating that the noise is not superimposed is output (for example, when the determination result signal VNS is changed to the low level). In this way, the magnitude of the noise can be indicated by the length of the period in which the noise is superimposed on the output voltage VOUT.

The count value of the counter 143 is stored in the noise detection result register (REG_NS) 144. For example, the switching of the determination result signal VNS of the wind comparator part 142 from the high level to the low level is used as a trigger to write the count value at this time of the counter circuit 143 into the noise detection result register 144.

The data processing control part 10 generates the base PWM signal VPWM by setting the control condition to the base PWM signal generation part 130 in such a way that the output voltage VOUT is equal to the target voltage VTGT and that the phase difference between the input voltage VIN and the input current IIN is reduced. The control content for the base PWM signal generation part 130 is the same as that in the first embodiment. For example, the base PWM signal VPWM and the selection signal VSEL are generated at the same timing as described above in FIG. 3.

Further, the data processing control part 10 generates the pulse signal VPLS by controlling the pulse signal generation part 136. More specifically, the data processing control part 10 determines the pulse width of the pulse signal VPLS based on the magnitude of the noise detected by the noise detection part 141 in order to generate the desired pulse signal VPLS. The specific control content for determining the pulse width of the pulse signal VPLS will be described in detail with reference to FIG. 8.

FIG. 8 is a diagram showing an example of the timing chart of the pulse signal VPLS_1 according to the second embodiment. As described above, since the control method for generating the base PMW signal VPWM and the selection signal VSEL is the same as the control method of the first embodiment, the PWM cycle TC and the PWM ON period TON are the same as those shown in FIG. 3. On the other hand, the time period T1 from time t1 to time t2 and the update timing of the various signals and registers in the time period T3 from time t3 to t4 shown in FIG. 3 are different from those of the first embodiment. Thus, the update timing of the various signals and registers in the time period T1 according to the second embodiment is shown in FIG. 8 as a representative example. Note that, in this figure, it is assumed that the value specifying a duty ratio of 10% is set as a default value for the set value CC of the pulse width setting register 138.

As shown in FIG. 8, at time t1 similarly to the first embodiment, when the data processing control part 10 provides a count operation start instruction to the counter circuit 137, the count operation of the counter circuit 137 is started, and then the pulse signal VPLS_1 (control signal VGD1) is changed to the high level. In this way, the switching element SW1 is put into the ON state. The current flowing through the coil L1 and the switching element SW1 is changed, and as a result, the output voltage VOUT is changed. When the output voltage VOUT is out of the voltage range W at time t21 due to this change in the voltage, the wind comparator part 142 of the noise detection part 141 changes the detection result signal VNS to the high level, and the counter circuit 143 starts timing. Then, when the output voltage VOUT is within the voltage range W at time t22, the wind comparator part 142 changes the detection result signal VNS from the high level to the low level. Because of this operation, the counter circuit 143 stops timing, and at the same time, the count value of the counter circuit 143 is written to the noise detection result register 144. At this time, the wind comparator part 142 further issues an interrupt request INT to the data processing control part 10 (CPU 11). The issued interrupt request INT is input to an interrupt control circuit not shown. Then, the interrupt control circuit outputs an interrupt signal to the data processing control part 10. In this way, the data processing control part 10 performs an interrupt process. More specifically, the data processing control part 10 takes the data (the amount of noise superimposed on the output voltage VOUT) of the noise detection result register 144. Then, the data processing control part 10 sets the pulse width (duty ratio) of the pulse signal VPLS_1 to the pulse width setting register 138 based on the data taken from the noise detection result register 144. More specifically, when the amount of noise is larger than the assumed value, the data processing control part 10 determines the pulse width of the next pulse signal VPLS so that the increase rate of the pulse width of the pulse signal VPLS_1 is reduced. When the amount of noise is smaller than the assumed value, the data processing control part 10 determines the pulse width of the next pulse signal VPLS so that the increase rate of the pulse width of the pulse signal VPLS_1 is increased.

For example, consider the case in which the initial setting is done so that the pulse width is gradually increased in the time period T1 in such a way that the reference pulse width of the pulse signal VPLS_1 to be first output is "10%", the reference pulse width of the pulse signal VPLS_1 to be second output is "30%", the reference pulse width of the pulse signal VPLS_1 to be third output is "50%", and so on.

In this case, for example, when determining that the amount of noise is larger than the reference value when the switching element SW1 is driven by the first output pulse signal VPLS_1 (duty ratio of 10%) in the time period T1, the data processing control part 10 sets a value (for example, 28%) smaller than the reference pulse width "30%", which is initially set as the pulse width of the pulse signal VPLS_1 to be second output, into the pulse width setting register 138. In this way, the time period in which the switching element SW1 is turned on by the second pulse signal VPLS_1 is reduced. As a result, it is possible to reduce the current change amount when the switching element is in the ON state. On the other hand, when determining that the amount of noise of the first pulse signal VPLS_1 is smaller than the reference value, the data processing control part 10 sets a value (for example 32%) larger than the reference pulse width "30%", which is initially set as the pulse width of the second pulse signal VPLS_1, into the pulse width setting register 138. According to this approach, it is possible to approximate to the normal PWM control while reducing the amount of noise. Note that the timing of updating the pulse width setting register 138 is not particularly limited as long as it is set before the pulse signal VPLS_1 for the next one cycle is generated. FIG. 8 illustrates the case in which the pulse width setting register 138 is updated at timing t23 and a value indicating a duty of "28%" is set.

After that, at timing t24, the generation of the pulse signal VPLS_1 (duty ratio of 28%) for the next one cycle is started. In this way, the switching element SW1 is put into the ON state. The current flowing through the coil L1 and the switching element SW1 is changed, and as a result, the output voltage VOUT is also changed. When the output voltage VOUT is out of the voltage range W at time t25 due to this change in the voltage, the wind comparator part 142 of the noise detection part 141 changes the detection result signal VNS to the high level, and the counter circuit 143 starts timing. Then, when the output voltage VOUT is within the voltage range W at time t26, the wind comparator part 142 changes the detection result signal VNS from the high level to the low level. Because of this operation, the counter circuit 143 stops timing, and the count value of the counter circuit 143 is written to the noise detection result register 144. At this time, similarly to the timing t22 described above, the interrupt request INT is issued and the data processing control part 10 starts the calculation of the pulse width (duty ratio) of the pulse signal VPLS_1. For example, when the amount of noise is larger than the reference value at the time when the switching element SW1 is driven by the second output pulse signal VPLS_1 (duty ratio of 28%) in the time period T1, the data processing control part 10 sets a value (for example, 48%) smaller than the reference pulse width "50%", which is initially set as the pulse width of the third pulse signal VPLS_1, into the pulse width setting register 138. On the other hand, when the amount of noise is smaller than the reference value, the data processing control part 10 sets a value (for example, 52%) larger than the initially set reference pulse width "50%" into the pulse width setting register 138. Note that FIG. 8 illustrates the case in which the pulse width setting register 138 is updated at timing t27 and the value indicating the duty ratio "52%" is set. In this way, after timing t28, a signal of the duty ratio "52%" is output as the third pulse signal VPLS_1 in the time period T1. The following process is the same as the process content from timing t24 to t28, and the pulse signal VPLS_1 of the pulse width determined based on the amount of noise is generated until time t2.

As described above, when the switching is controlled in such a way that the pulse width of the control signal VGD1, VGD2 (pulse signal VPLS) is gradually increased in the first period T1 of the PWM ON period TON in the PWM cycle TC, it is possible to further reduce the switching noise by changing the increase rate of the pulse width according to the magnitude of the actually measured switching noise.

Further, also in the last period T2 of the PWM ON period TON, the pulse signal VPLS_2 is generated by the same control method as that in the time period T1 described above. For example, in the time period T2, when the amount of noise detected by the noise detection part 141 is larger than the assumed value, the data processing control part 10 calculates the pulse width of the next pulse signal VPLS so that the decrease rate of the pulse width of the pulse signal VPLS_2 is reduced. When the amount of noise is smaller than the assumed value, the data processing control part 10 calculates the pulse width of the next pulse signal VPLS_2 in such a way that the decrease rate of the pulse width of the next pulse signal VPLS_2 is increased. For example, consider the case in which the initial setting is done so that the pulse width is gradually reduced in the time period T2 in such a way that the reference pulse width of the pulse signal VPLS_2 to be first output is "70%", the reference pulse width of the pulse signal VPLS_2 to be second output is "50%", the reference pulse width of the pulse signal VPLS_2 to be third output is "30%", and so on.

For example, when determining that the amount of noise is larger than the reference value at the time when the switching element SW1 is driven by the first output pulse signal VPLS_2 (duty ratio of 70%) in the time period T2, the data processing control part 10 sets a value (for example, 51%) larger than the initially set reference pulse width "50%" as the pulse width of the pulse signal VPLS_2 to be second output, into the pulse width setting register 138. In this way, the time period to turn off the switching element SW1 by the second pulse signal VPLS_2 is reduced. As a result, it is possible to reduce the amount of change in the current when the switching element is in the OFF state. On the other hand, when determining that the amount of noise of the first pulse signal VPLS_2 is smaller than the reference value, the data processing control part 10 sets a value (for example, 49%), which is smaller than the reference pulse width "50%", into the pulse width setting register 138. According to this approach, it is possible to approximate to the normal PWM control while reducing the amount of noise.

In this way, also in the last time period T2 of the PWM ON period TON in the PWM cycle TC, it is possible to further reduce the switching noise by changing the decrease rate of the pulse width of the control signal VGD1, VGD2 (pulse signal VPLS_2) according to the magnitude of the actually measured switching noise.

As described above, with the switching power source device 200 according to the second embodiment, it is possible to further reduce the switching noise by driving the switching element by the pulse signal VPLS whose pulse width is gradually changed in the first period T1 and the last period T3 during the PWM ON period TON in the PWM cycle TC, and by changing the amount of increase and decrease in the pulse width according to the actually measured amount of noise. As a result, it is possible to further reduce the harmonic noise in the switching power source device.

The invention made by the present inventors has been concretely described based on the embodiments. However, it is needless to say that the present invention is not limited to the above embodiments and various modifications and alterations can be made within the scope of the present invention.

For example, in the switching power source devices 100 and 200 according to the first and second embodiments, the switching is controlled by the pulse signal VPLS whose pulse width is gradually changed in the first period T1 and the last period T3 during the PWM ON period TON in the PWM cycle TC. However, it is possible to configure in such a way that the switching is controlled by the pulse signal VPLS only in the time period T1 or T3. For example, it is possible to configure in such a way that the switching is driven by the pulse signal VPLS only in the first period T1 and is driven by the base PWM signal VPWM in the middle period T2 and the last period T3. Further, it is also possible to configure in such a way that the switching is controlled by the base PWM signal VPWM in the first period T1 and the middle period T2, and that the switching is controlled by the pulse signal VPLS only in the last period T3.

The pulse signal VPLS_1, VPLS_2 can be any signal as long as it can gradually change the time period in which the switching element SW1, SW2 is turned on, and is not limited to the signal whose pulse cycle is fixed and whose duty ratio is changed as described above. For example, even if the pulse signal VPLS_1, VPLS_2 is a signal whose pulse cycle is gradually increased or reduced, it is possible to reduce the switching noise.

Although in the second embodiment the pulse width of the pulse signal VPLS_1, VPLS_2 is updated for each pulse according to the amount of noise, it is possible to configure in such a way that the pulse width of the pulse signal VPLS_1, VPLS_2 is updated for every PWM cycle TC. More specifically, in FIG. 3, the pulse width of the pulse signal VPLS_1 to be output in the period of time t7 to t8 in the second PWM cycle TC is determined based on the amount of noise measured in the time period T1 of time t1 to t2 in the first PWM cycle TC (for example, the maximum value, average value, and the like, of the amount of noise in the same period). For example, the duty ratio of the pulse signal VPLS_1 output in the period T1 of time t1 to t2 is changed to 10%, 30%, and 50%. In this case, if the amount of noise in the time period T1 is larger than the assumed value, the switching can be controlled in such a way that the pulse number to be output in the same period is increased by reducing the duty ratio of the pulse signal PLS_1 in the period of time t7 and t8 to 5%, 15%, 35%, and 55%. According to this approach, it is possible to reduce the switching noise generated in the PWM ON period TON in the second PWM cycle TC.

Although in the first and second embodiments it is assumed that the PFC circuit 1, 6 is a critical mode PFC circuit, a continuous mode PFC circuit can also be used. Further, it is also possible that the PFC circuit 1, 6 is configured with the voltage converter circuit 3 of the synchronous rectification method to configure the rectifier element D1, D2 with a MOS transistor for synchronous rectification.

INDUSTRIAL APPLICABILITY

The present invention can be widely applied to various switching power source devices that configure not only AC/DC converters for converting AC voltage to DC voltage, but also DC/DC converters.

EXPLANATION OF REFERENCE NUMERALS 100 switching power source device (AC/DC converter)
20 AC power source
VAC AC voltage
1 PFC circuit
2 rectifier part
21 diode bridge circuit
CRCT capacitance
VIN input voltage
IIN input current
3 voltage converter circuit
L1A, L1B, L2A, L2B coil
SW1, SW2 switching element
D1, D2 rectifier element
COUT output capacitance
NSW1, NSW2 node
4 output voltage detection part
R1, R2 resistance
VOUT output voltage
VSEL detection voltage
5 control part
10 data processing control part
11 CPU
12 memory part
13A, 13B PWM timer part
14 to 16 A/D conversion parts
DIS1, DIS2, DVS conversion result
VGD1, VGD2 control signal
130 base PWM signal generation part
131 signal generation circuit
132, 133 compare register
134 counter circuit
135 PWM cycle setting register
136 pulse signal generation part
137 counter circuit 138 pulse width setting register
139 signal generation circuit (PLS_GEN)
140 selection part
VPWM base PWM signal
VPLS, VPLS_1, VPLS_2 pulse signal
VSEL selection signal
30, 40 count value
200 switching power source device (AC/DC converter)
6 PFC circuit
7 control part
23A, 23B PWM timer part
141 noise detection part
142 wind comparator part
143 counter circuit
144 noise detection result register
VNS detection result signal
INT interrupt request

What is claimed is:

1. A switching power source device for controlling a current flowing through a coil by turning on/off a switching element by a PWM control to obtain a desired DC voltage,
wherein in a PWM ON period to turn on the switching element by the PWM control, a switching control of the switching element is enabled by a first pulse signal whose cycle is shorter than a PWM cycle based on the PWM control and whose pulse width is gradually increased, in a first period just after the PWM ON period is started, and
wherein the switching control of the switching element is enabled by the PWM signal based on the PWM control after the first period has elapsed,
wherein an increase rate of a pulse width of the first pulse signal in the first period is controlled to be reduced when a switching noise superimposed on the DC voltage is larger than a reference value, and is controlled to be increased when the switching noise is smaller than the reference value,
wherein when the switching noise, which is generated due to the switching of the switching element by a last output first pulse signal in the first period, is larger than the reference value, the switching power source device makes the pulse width of the first pulse signal to be next output smaller than a reference pulse width, and
wherein when the switching noise is smaller than the reference value, the switching power source device makes the pulse width of the first pulse signals to be next output larger than the reference pulse width.

2. The switching power source device according to claim 1,
wherein the length of the period in which the DC voltage is out of a predetermined voltage range is defined as a magnitude of the switching noise.

3. The switching power source device according to claim 1,
wherein the switching control of the switching element is enabled by the PWM signal in a second period after the first period has elapsed in the PWM ON period, and
wherein the switching control of the switching element is enabled by a second pulse signal whose cycle is shorter than the PWM cycle and whose pulse width is gradually reduced, in a third period after the second period has elapsed until the PWM ON period is completed.

4. The switching power source device according to claim 3,
wherein a decrease rate of the pulse width of the second pulse signal in the third period is controlled to be reduced when the switching noise superimposed on the DC voltage is larger than a reference value, and is controlled to be increased when the switching noise is smaller than the reference value.

5. The switching power source device according to claim 4,
wherein when the switching noise, which is generated due to the switching of the switching element by the last output second pulse signal in the third period, is larger than the reference value, the switching power source device makes the pulse width of the second pulse signal to be next output larger than a reference pulse width, and
wherein when the switching noise is smaller than the reference value, the switching power source device makes the pulse width of the second pulse signal to be next output smaller than the reference pulse width.

6. A semiconductor device for controlling the ON/OFF of a switching element in a switching power source device for converting an input voltage to a target DC voltage, and at the same time for improving a power factor,
wherein the semiconductor device comprises:
a timer part for generating a control signal to control the ON/OFF of the switching element; and
a data processing control part for calculating a PWM ON period to turn on the switching element so that an output voltage is equal to the target DC voltage and that a phase difference between the input voltage and an input current that is input to the switching power source device is reduced, and at the same time for controlling a timer part based on a calculation result,
wherein the data processing control part controls the timer part to enable a first pulse signal, whose cycle is shorter than a PWM signal according to a calculated PWM ON period and whose pulse width is gradually increased, to be output as the control signal in a first period just after the start of the calculated PWM ON period, and to enable the PWM signal to be output as the control signal after the first period has elapsed.

7. The semiconductor device according to claim 6,
wherein the data processing control part controls the timer part to enable a second pulse signal, whose cycle is shorter than the PWM signal and whose pulse width is gradually reduced, to be output as the control signal in a second period just before the end of the calculated PWM ON period.

8. The semiconductor device according to claim 7, further comprising:
a comparator part for determining whether or not a DC voltage is out of a predetermined voltage range; and
a timing part for timing a period in which the DC voltage is out of the predetermined voltage range,
wherein when a timing result by the timing part is larger than a reference value when the switching element is switched by the last output first pulse signal in the first period, the data processing control part makes the pulse width of the first pulse signal to be next output smaller than a reference pulse width, and
wherein when the timing result is smaller than the reference value, the data processing control part makes the pulse width of the first pulse signal to be next output larger than the reference pulse width.

9. The semiconductor device according to claim 8,
wherein when the timing result by the timing part is larger than a reference value when the switching element is switched by the last output second pulse signal in the second period, the data processing control part makes the pulse width of the second pulse signal to be next output larger than a reference pulse width, and wherein when the timing result is smaller than the reference value, the data processing control part makes the pulse width of the second pulse signal to be next output smaller than the reference pulse width.

10. The semiconductor device according to claim 9, wherein the timer part comprises:

a first signal generation part for generating the PWM signal according to the PWM ON period calculated by the data processing control part;

a second signal generation part for generating the first pulse signal and the second pulse signal; and a signal selection part for outputting the first pulse signal generated by the second signal generation part in the first period, outputting the second pulse signal generated by the second signal generation part in the second period, and outputting the PWM signal generated by the first signal generation part in a period other than the first and second periods.

11. An AC/DC converter comprising:

a rectifier circuit for rectifying an AC voltage to output a rectified AC voltage;

a voltage converter circuit for inputting the voltage rectified by the rectifier circuit, converting an input voltage into a target DC voltage by controlling a current flowing through a coil by a switching element, and outputting the DC voltage; and a control part for calculating a PWM ON period to turn on the switching element so that an output voltage of the voltage converter circuit is equal to the target DC voltage and that a phase difference between the input voltage of the voltage converter circuit and an input current is reduced, and at the same time for controlling the ON/OFF of the switching element based on a calculation result, wherein the control part is enabled to output a first pulse signal whose cycle is shorter than a PWM signal according to a calculated PWM ON period and whose pulse width is gradually increased, as a control signal in a first period just after a start of the PWM ON period, wherein the control part is enabled to output the PWM signal as the control signal after the first period has elapsed, wherein when a switching noise generated due to the switching of the switching element by a last output first pulse signal in the first period, is larger than a reference value, the control part makes the pulse width of the first pulse signal to be next output smaller than a reference pulse width, and wherein when the switching noise is smaller than the reference value, the control part makes the pulse width of the first pulse signal to be next output larger than the reference pulse width.

12. The AC/DC converter according to claim 11, wherein the control part is enabled to output a second pulse signal, whose cycle is shorter than the PWM signal and whose pulse width is gradually reduced, as the control signal in a second period just before the end of the calculated PWM ON period.

13. The AC/DC converter according to claim 12, wherein when the switching noise generated due to the switching of the switching element by the last output second pulse signal in the second period, is larger than a reference value, the control part makes the pulse width of the second pulse signal to be next output larger than a reference pulse width, and wherein when the switching noise is smaller than the reference value, the control part makes the pulse width of the second pulse signal to be next output smaller than the reference pulse width.

14. The AC/DC converter according to claim 13, wherein the control part is configured to include a microcontroller.

* * * * *